(12) United States Patent
Sengodan

(10) Patent No.: US 11,574,756 B2
(45) Date of Patent: Feb. 7, 2023

(54) DETERMINE SOLENOID PLUNGER POSITION OF A CURRENT CONTROLLED SOLENOID USING POSITION FEEDBACK

(71) Applicant: United Technologies Corporation, Farmington, CT (US)

(72) Inventor: Rajkumar Sengodan, Tamilnadu (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 125 days.

(21) Appl. No.: 16/734,791

(22) Filed: Jan. 6, 2020

(65) Prior Publication Data

US 2021/0134502 A1 May 6, 2021

(30) Foreign Application Priority Data

Nov. 4, 2019 (IN) .............................. 201911044643

(51) Int. Cl.
*H01F 7/18* (2006.01)
*G01R 31/72* (2020.01)
*G01R 19/00* (2006.01)

(52) U.S. Cl.
CPC ....... *H01F 7/1844* (2013.01); *G01R 19/0092* (2013.01); *G01R 31/72* (2020.01); *H01F 2007/185* (2013.01); *H01F 2007/1866* (2013.01)

(58) Field of Classification Search
CPC ............. H01F 7/1844; H01F 2007/185; H01F 2007/1866; G01R 31/72; G01R 19/0092
USPC ....................................................... 361/160
See application file for complete search history.

(56) References Cited

U.S. PATENT DOCUMENTS

| 4,418,332 A * | 11/1983 | Mefford ............... H03K 5/1252 340/146.2 |
| 5,784,245 A | 7/1998 | Moraghan et al. |
| 6,049,471 A * | 4/2000 | Korcharz .......... H02M 3/33592 363/20 |
| 6,211,665 B1 | 4/2001 | Ahrendt et al. |

(Continued)

FOREIGN PATENT DOCUMENTS

EP  1867903 A2  12/2007

OTHER PUBLICATIONS

Extended European Search Report Issued in European Application No. 20203544.0-1203 dated Mar. 26, 2021; 6 Pages.

*Primary Examiner* — Thienvu V Tran
*Assistant Examiner* — Sreeya Sreevatsa
(74) *Attorney, Agent, or Firm* — Cantor Colburn LLP

(57) ABSTRACT

Provided are embodiments for determining solenoid plunger position by performing a method which includes generating, by a first signal circuit, a first signal based at least in part on a pull-in current value of a current applied to a solenoid coil of a solenoid. The method further includes generating, by a second signal circuit, a second signal by applying a time delay to the first signal. The method further includes comparing, by a comparator circuit, the first signal and the second signal to determine whether a plunger of the solenoid has moved within the solenoid from a first position to a second position. The method further includes, responsive to determining that the plunger of the solenoid has moved within the solenoid from the first position to the second position, reducing the current applied to the solenoid coil of the solenoid from the pull-in current value to a hold current value.

19 Claims, 7 Drawing Sheets

(56) References Cited

U.S. PATENT DOCUMENTS

| | | | |
|---|---|---|---|
| 6,671,158 B1* | 12/2003 | Underwood | H01H 47/325 |
| | | | 361/153 |
| 7,483,253 B2 | 1/2009 | Schumacher | |
| 10,253,900 B2 | 4/2019 | Jefford et al. | |
| 2016/0125993 A1* | 5/2016 | Narayanasamy | H01F 7/1844 |
| | | | 361/160 |
| 2018/0292445 A1 | 10/2018 | Narayanasamy et al. | |
| 2019/0156982 A1 | 5/2019 | Lecheler et al. | |

* cited by examiner

DETERMINE SOLENOID PLUNGER POSITION OF A CURRENT CONTROLLED SOLENOID USING POSITION FEEDBACK

CROSS REFERENCE TO RELATED APPLICATION

This application claims the benefit of Indian Patent Application No. 201911044643, filed Nov. 4, 2019, which is incorporated herein by reference in its entirety.

BACKGROUND

Embodiments described herein generally relate to drive circuits, and more specifically to a system and method for determining solenoid plunger position of a current controlled solenoid using position feedback.

A solenoid is an electromechanical device that transduces or changes an electrical signal, which is input to the wire coil of the solenoid, into a corresponding mechanical movement of a metallic device, such as a rod, disposed within the coil. The electrical current flowing through the wire coil creates a magnetic field that either attracts or repels the metallic device. The metallic device is typically connected to a mechanical device, such as an actuator, which is physically moved along with the metallic device of the solenoid by the magnetic field.

Solenoids are commonly used in a wide range of both commercial and military devices. For example, solenoids are used on aircraft to control various mechanical devices and variables.

BRIEF DESCRIPTION

According to an embodiment, a method for determining solenoid plunger position is provided. The method includes generating, by a first signal circuit, a first signal based at least in part on a pull-in current value of a current applied to a solenoid coil of a solenoid. The method further includes generating, by a second signal circuit, a second signal by applying a time delay to the first signal. The method further includes comparing, by a comparator circuit, the first signal and the second signal to determine whether a plunger of the solenoid has moved within the solenoid from a first position to a second position. The method further includes responsive to determining that the plunger of the solenoid has moved within the solenoid from the first position to the second position, reducing the current applied to the solenoid coil of the solenoid from the pull-in current value to a hold current value.

In addition to one or more of the features described herein, or as an alternative, further embodiments include that comparing the first signal and the second signal further comprises comparing a peak envelope of the first signal with a peak envelope of the second signal.

In addition to one or more of the features described herein, or as an alternative, further embodiments include that the peak envelope of the first signal comprises a first peak value and a first valley value, and wherein the peak envelope of the second signal comprises a second peak value and a second valley value.

In addition to one or more of the features described herein, or as an alternative, further embodiments include varying a crossover threshold for the comparator circuit based at least in part on a tolerance of a component of the comparator circuit or based at least in part on a type of the solenoid.

In addition to one or more of the features described herein, or as an alternative, further embodiments include performing fault protection.

In addition to one or more of the features described herein, or as an alternative, further embodiments include that the fault protection is performed after a fault detect time period of the solenoid being in an ON state.

In addition to one or more of the features described herein, or as an alternative, further embodiments include that the fault detect time period is calculated based at least in part on a maximum time taken to activate a HOLD mode for the solenoid.

In addition to one or more of the features described herein, or as an alternative, further embodiments include that the hold current value is 30% to 40% of the pull-in current value.

In addition to one or more of the features described herein, or as an alternative, further embodiments include activating pulse width modulation responsive to determining that the plunger of the solenoid has moved within the solenoid from the first position to the second position.

In addition to one or more of the features described herein, or as an alternative, further embodiments include that the comparator circuit comprises a first comparator and a second comparator, and that the first comparator and the second comparator generate pull-in and reset signals based at least in part on the first signal and the second signal.

In addition to one or more of the features described herein, or as an alternative, further embodiments include that the second signal circuit comprises a low pass network and an integrator amplifier.

According to another embodiment, a system is provided that includes a first signal circuit to generate a first signal based at least in part on a pull-in current value of a current applied to a solenoid coil of a solenoid. The system further includes a second signal circuit to generate a second signal by applying a time delay to the first signal. The system further includes a comparator circuit to compare the first signal and the second signal to determine whether a plunger of the solenoid has moved within the solenoid from a first position to a second position. The system further includes a control logic to reduce the current applied to the solenoid coil of the solenoid from the pull-in current value to a hold current value responsive to determining that the plunger of the solenoid has moved within the solenoid from the first position to the second position.

In addition to one or more of the features described herein, or as an alternative, further embodiments include that comparing the first signal and the second signal further comprises comparing a peak envelope of the first signal with a peak envelope of the second signal.

In addition to one or more of the features described herein, or as an alternative, further embodiments include that the peak envelope of the first signal comprises a first peak value and a first valley value, and wherein the peak envelope of the second signal comprises a second peak value and a second valley value.

In addition to one or more of the features described herein, or as an alternative, further embodiments include fault protection logic to perform fault protection.

In addition to one or more of the features described herein, or as an alternative, further embodiments include that the fault protection is performed after a fault detect time period of the solenoid being in an ON state.

In addition to one or more of the features described herein, or as an alternative, further embodiments include that the fault detect time period is calculated based at least in part on a maximum time taken to activate a HOLD mode for the solenoid.

In addition to one or more of the features described herein, or as an alternative, further embodiments include that the hold current value is 30% to 40% of the pull-in current value.

In addition to one or more of the features described herein, or as an alternative, further embodiments include that the comparator circuit comprises a first comparator and a second comparator, and that the first comparator and the second comparator generate pull-in and reset signals based at least in part on the first signal and the second signal.

In addition to one or more of the features described herein, or as an alternative, further embodiments include that the second signal circuit comprises a low pass network and an integrator amplifier.

The foregoing features and elements may be combined in various combinations without exclusivity unless expressly indicated otherwise. These features and elements, as well as the operation thereof, will become more apparent in light of the following description and the accompanying drawings. It should be understood, however, that the following description and drawings are intended to be illustrative and explanatory in nature and non-limiting.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Figure 1A:
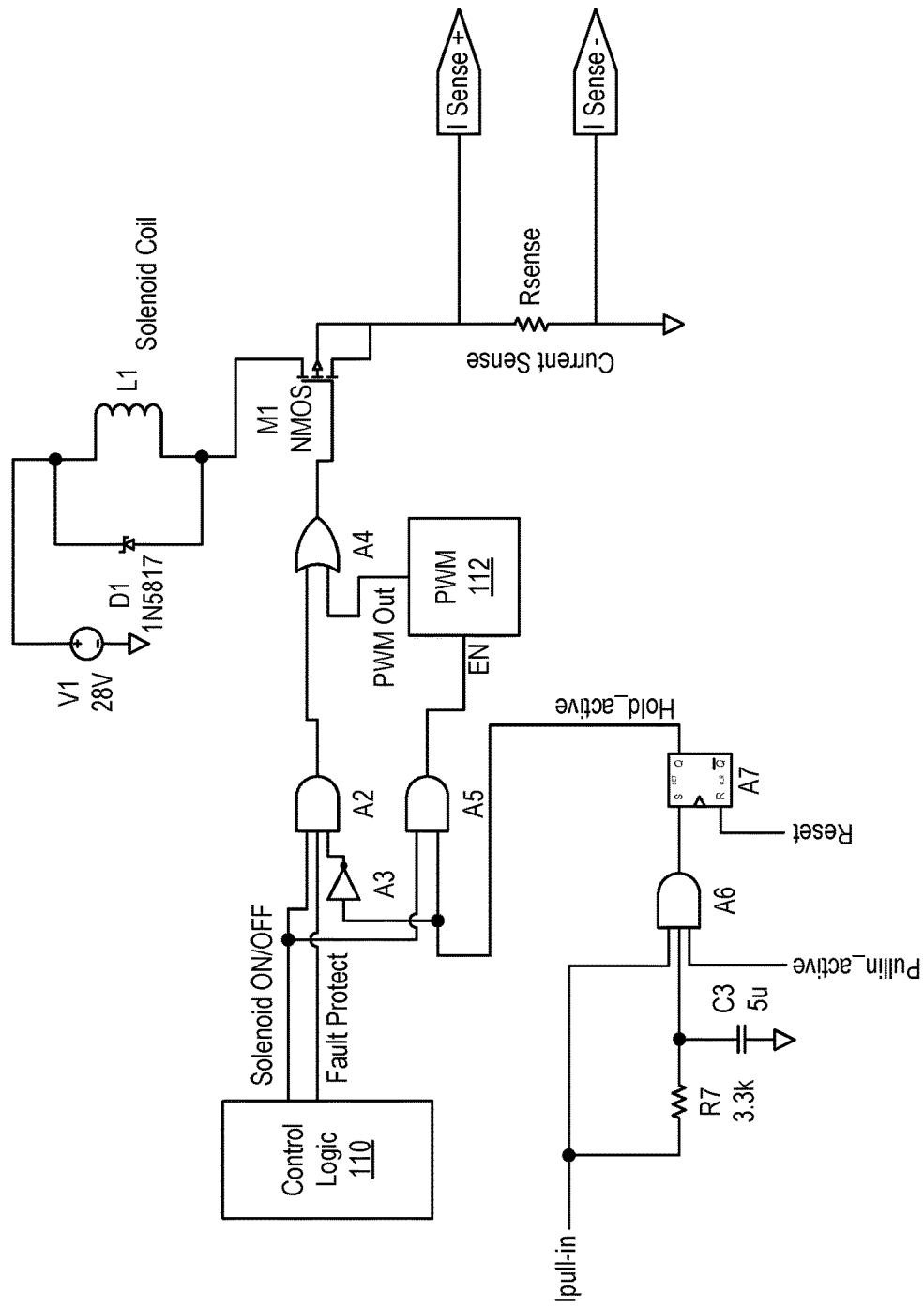
FIGS. 1A and 1B depict a schematic of a circuit for a current controlled solenoid drive with position feedback according to one or more embodiments described herein.

Embodiments described herein provide a circuit and method for solenoid drive with position feedback to determine solenoid plunger position. In particular, the solenoid plunger position can be determined by performing back electromotive force (EMF) tracking and fault protection. The embodiments described herein can be configured in an actuator drive application that needs to identify, with precision, the solenoid plunger position. A challenge in choosing a drive circuit for solenoid-based actuators is the need for accurate position detection of the solenoid plunger during pull-in drive. With solenoid plunger position feedback control, the proposed drive circuit described herein sequence the pull-in and hold current effectively for precision position drive of the solenoid plunger.

It should be appreciated that the presently described embodiments utilize solenoid operation for detecting pull-in and toggling to hold current mode. Linear solenoid locks and brakes have many applications. As an example, such locks and brakes find application in aircraft where safety is critical and where it is useful to lock/maintain components such as flaps, doors, brakes, etc., in position.

In some cases, a time period during which the higher pull-in current is supplied is more than long enough than the nominal pull-in time period to linearly move the solenoid plunger to its end position for the second state (i.e., plunger moved to next position). However, situations can arise that prevent the solenoid plunger reaching the end position before the pull-in current is stopped. For example, mechanical or electrical abnormalities or disturbances can cause the response time to be longer than expected. As another example, mechanical jams can occur. This gives rise to safety and performance issues, such as trying to move components while a brake/lock is still locked or the component is not fully locked or arrested.

An example of a conventional approach for solenoid plunger position sensing includes hall effect sensors to detect the position of the plunger. The mechanical mounting of these sensors are complex and their performance is affected by aging and external field. In addition, the hall effect sensor provides a signal at the end of the plunger movement and, therefore, cannot detect slow movement of the solenoid plunger.

Another example of a conventional approach for solenoid plunger sensing uses algorithmic solutions. These algorithms may fail during solenoid aging, during temperature variation, or during the slow movement of the plunger.

Another example of a conventional approach for solenoid plunger sensing uses fixed references for detecting peak and valley currents. In such approaches, a peak value of a first current signal is compared to a valley value of a second current signal. The problem arises when the solenoid plunger moves slowly due to solenoid aging and load factors. In such cases, the valley value may not be close enough to the first peak value due to a predefined threshold (i.e., a first peak and a second valley happen at different time stamps and thus the comparator hysteresis needs to be provided to detect pull-in current). The valley point can vary significantly with respect to solenoid type (i.e., threshold detection is based on first signal peak to second signal valley point). Accordingly, a threshold level between first and second signals is to be level shifted accurately with respect to the solenoid for worst-case operation. Whereas conventional approaches provide envelope tracking in which the second signal is allowed to crossover the first signal when the plunger reaches to a second position, the present techniques minimize the requirement for tuning required on level-shifted network. A higher manufacturing yield rate results.

Additional advantages include ease of configuring in existing solenoid drive circuits, simple logic drive circuit for solenoid position detection and control, and fault protection logic that features protection against solenoid failures due to mechanical disturbances, aging, etc.

The embodiments described herein provide reliable feedback of the position of the solenoid armature. If used instead of a position sensor such as a proximity sensor, the embodiments described herein provide in a simpler, smaller, lighter, less expensive device even if redundancy is incorporated.

Figure 1B:
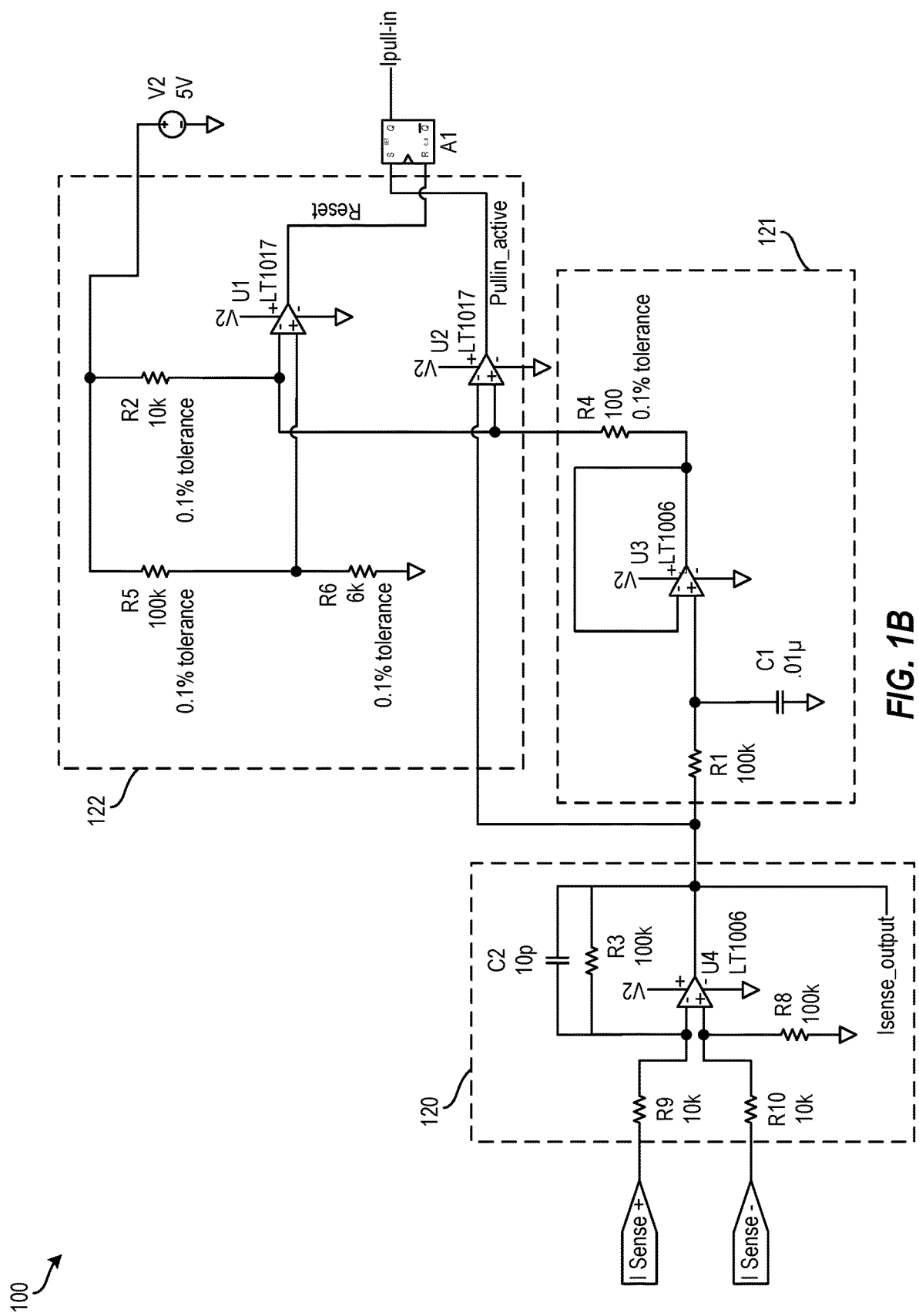

Together, FIGS. 1A and 1B depict a schematic of a circuit 100 for a current controlled solenoid drive with position feedback according to one or more embodiments described herein. More particularly, FIGS. 1A and 1B provide a schematic view of a solenoid drive and position feedback for an armature or plunger held under a spring force and linearly moveable arranged within a solenoid coil. When the solenoid coil is de-energized, the spring force will keep the plunger in a default state. When the coil is energized, the resulting magnetic force will overcome the spring force and move the plunger to a second state in a linear position. Depending on the application, the first state can be a locked state and the second state an unlocked state or vice versa.

It is to be noted that solenoid aging, as well as voltage and temperature variations, can affect the position of the plunger of the solenoid using the power on/power off control. To move the plunger to the second state, a high level of current (pull-in current) is applied to the solenoid for a predefined period of time (usually longer than its response time in moving to the second state), after which, once the plunger has moved completely, the solenoid coil needs only approximately 30%-40% of pull-in current. This lower level of current is referred to as holding current or hold current and is applied to maintain the plunger in the same position.

According to embodiments described herein, the pull-in is detected based on the crossover of two signal envelopes at one point and a hold mode is detected once the amplitude level of the two signals becomes equal to one another (i.e., steady-state maximum pull-in current).

In a system for operating a solenoid, the circuit 100 detects complete movement of the plunger of the solenoid. The circuit 100 includes a differential amplifier U4 in a first signal circuit 120 for measuring current through the solenoid and generating a first signal. The first signal is measured at the output of U4. The differential amplifier U4, which is configured with a predefined gain value, receives the current signal (I sense +/−) from precision current sense resistor Rsense and generates the first signal. The differential amplifier U4 is supplied with 5V rail (V2) for example to interface with digital logic IC. The supply rail can be configured with any voltage depending on interface requirement and is optional. The output signal (i.e., the first signal) of the differential amplifier U4 is fed to a second signal circuit 121 that includes a low pass RC (R1, C1) network as an integrator and a buffer network U3, which generates a time-delayed second signal. The second signal is measured at the output of U3 non-inverting node. It is to be considered that large R1, C1 values can eventually tend to slip on tracking the signal envelope because the output voltage is proportional to the integral of the input voltage.

Figure 2A:
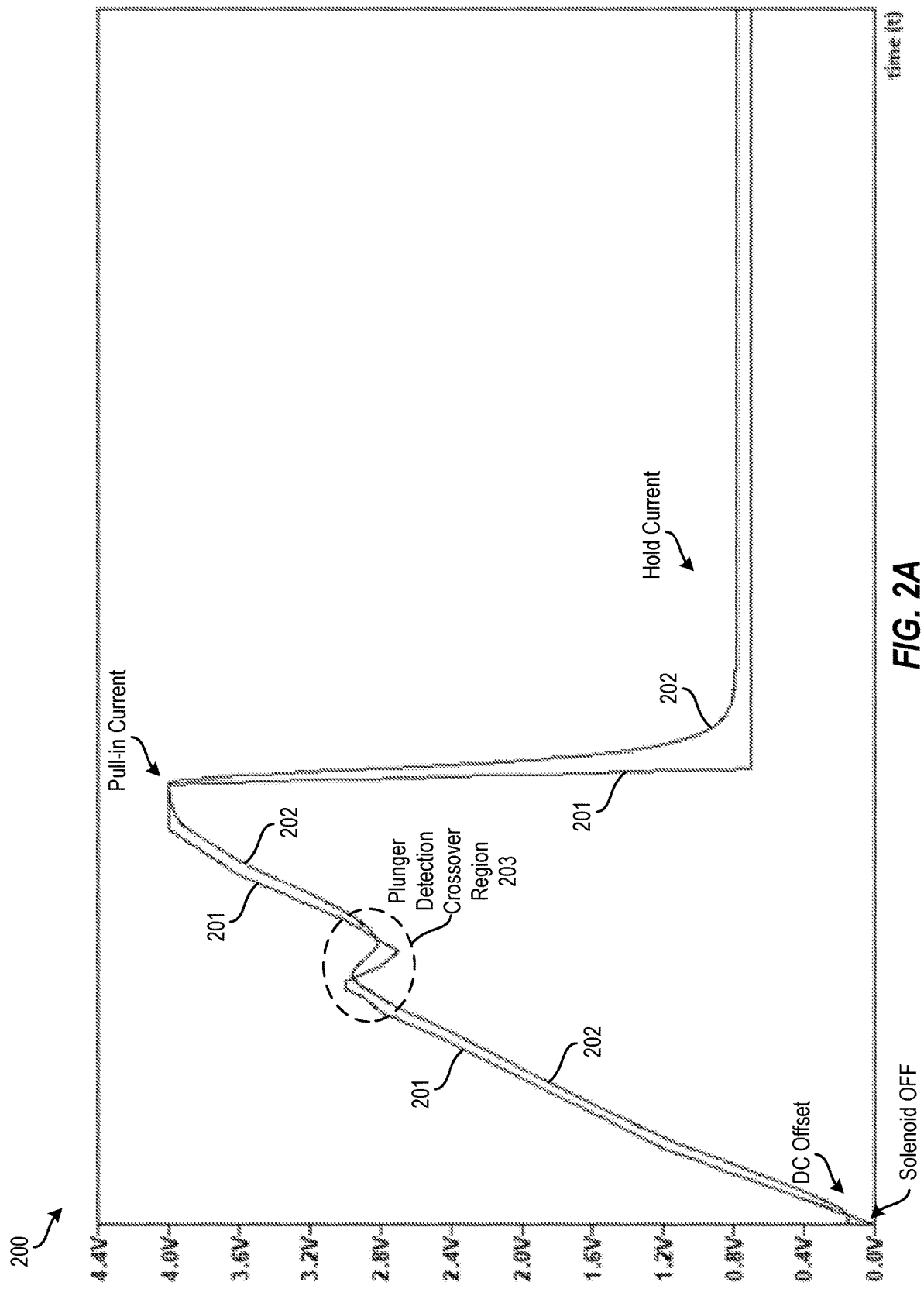
FIG. 2A depicts a graph of position feedback envelope waveforms according to one or more embodiments described herein.
Figure 2B:
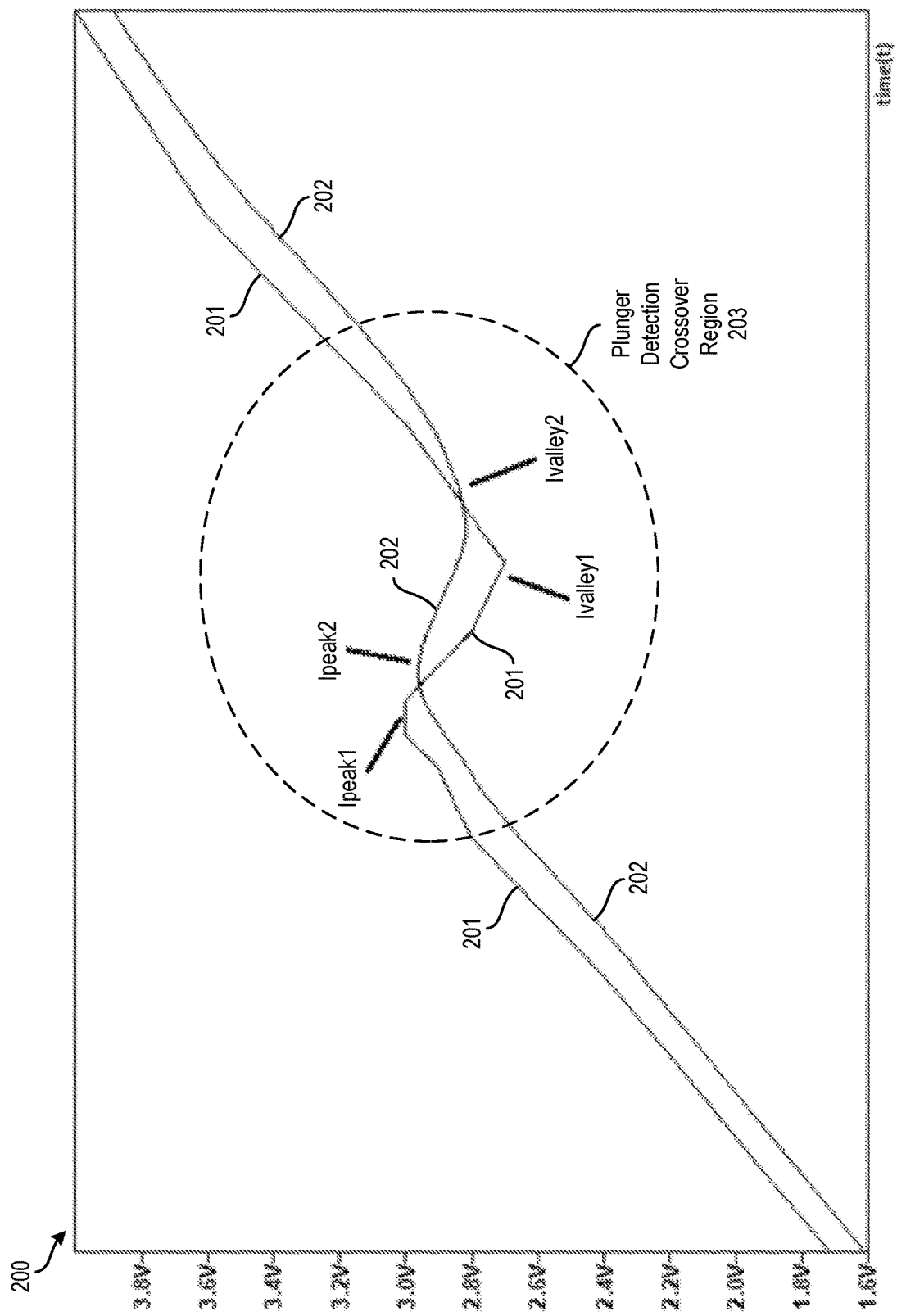
FIG. 2B depicts a graph of the position feedback envelope waveforms of FIG. 2A according to one or more embodiments described herein.

Two comparators U1 and U2 generate pull-in and reset signals for SR flip-flop based on the Rsense output (described in more detail herein). The comparators U1, U2 compare the peak envelope of the sensed signal (i.e., first signal) with the delayed signal (i.e., second signal) as shown in FIGS. 2A and 2B. In particular, FIGS. 2A and 2B depict a graph 200 of position feedback envelope waveforms according to one or more embodiments described herein. In this example, if the second signal 202 crosses over the first signal 201 (as shown in the plunger detection crossover region 203), then complete movement of the solenoid is detected.

With continued reference to FIGS. 1A and 1B, the circuit 100 for operating a solenoid applies a voltage across a solenoid coil L1 and measures current through the coil at Rsense to generate the first signal ($I_{peak1}$, $I_{valley1}$) as shown in the plunger detection crossover region 203 of FIGS. 2A and 2B. The circuit 100 further includes a combination of components, among others, configured and arranged as shown including: AND gates A2, A5, A6; OR gate A4; MOSFET M1 can include a gate drive circuit and is controlled by output of OR gate A4; INV gate A3; SR flipflop A7; and pulse width modulation generation (PWM) 112. Components A6, A7, A5 enable the PWM 112 once the plunger moves to the second position. Component A3 provides inverted logic to enable/disable component A2 output. Components A2, A5 are enabled only if Solenoid ON input is received. Component A6 receives input from component A1 output (Ipull-in), time delay RC network (R7,C3), and Pullin_active (comparator U2). The hold_active (from component A7) enables Hold mode after reaching maximum pull-in current. The charging time delay of RC network (R7,C3) can be configured with 0.5τ time constant equal to peak-to-valley duration considering the crossover time (IPEAK2 to IVALLEY2) and input logic HIGH threshold level of AND gate A6.

Figure 3A:
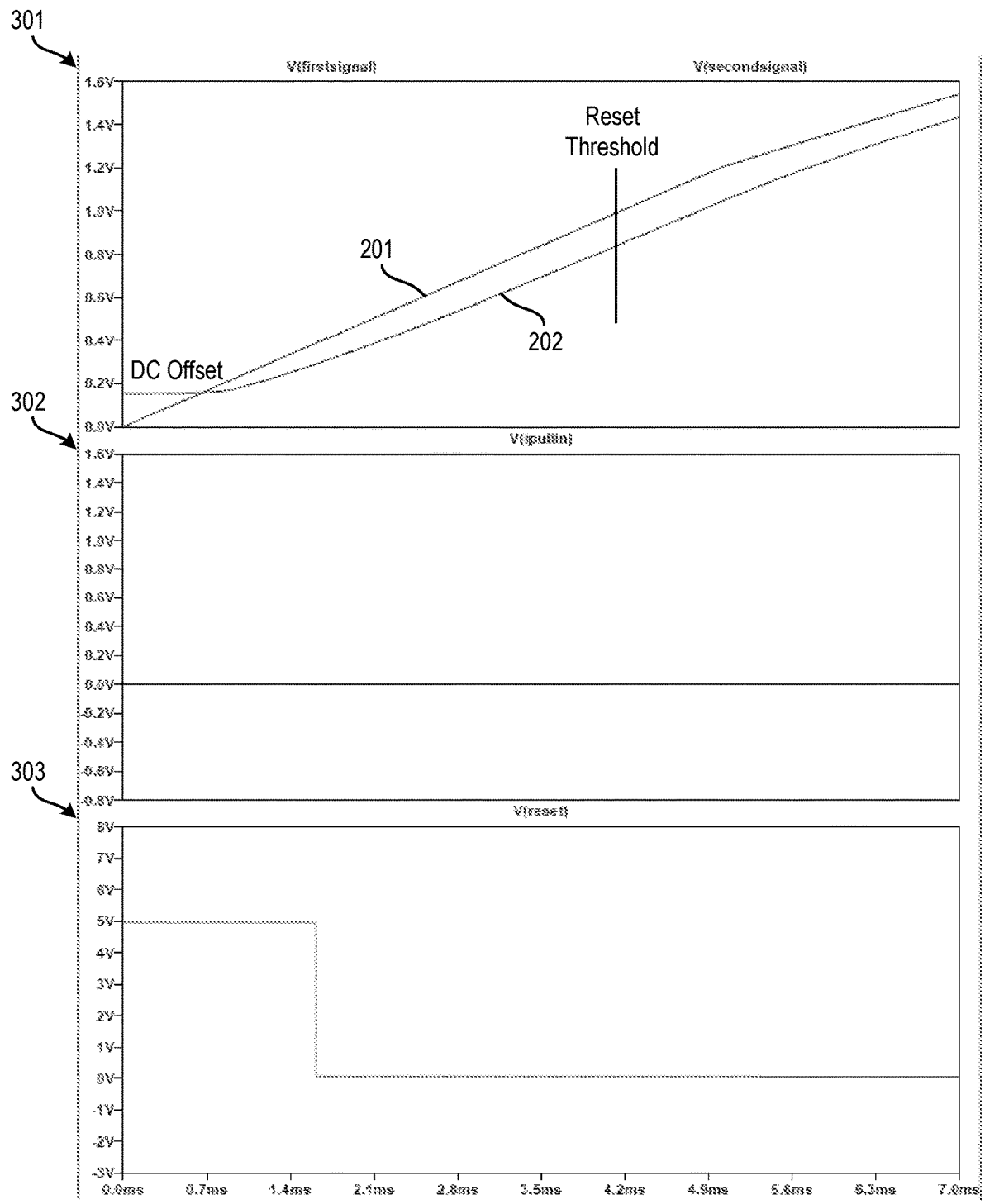
FIG. 3A depicts graphs of solenoid drive control logic waveforms during a power-on mode according to one or more embodiments described herein.

A comparator circuit 122 detects a peak of the current through the coil represented by the first signal. The resistor network (R2, R4) provides a DC offset to the second signal in order to compensate for the time delay provided by R1, C1 in the second signal circuit 121; further R1, C1 acts as an integrator for fast variation of signal amplitude. The integrating action contributes to detecting the pull-in current during the crossover region of the second signal. It is to be noted that the time delay can be configured with 1τ (time constant) and positive level shifted by DC offset R2 and R4 with a predetermined value as shown in FIG. 3A. In particular, FIG. 3A depicts graphs 301, 302, 303 of solenoid drive control logic waveforms during a power-on mode according to one or more embodiments described herein. The graph 301 shows the voltages of the first signal 201 and the second signal 202, the graph 302 shows the voltage of the ipullin current signal, and the graph 303 shows the voltage of the reset signal.

With continued references to FIGS. 1A and 1B, the resistor network R5, R6 provides a reference voltage for the U1 comparator to compare the level-shifted second signal in order to enable the SR flip-flop A1 reset mode. Therefore, the SR flip-flop A1 sets (Q) to logic high, post movement of the plunger.

In an example, consider the solenoid is energized by enabling the switch M1. In such cases, the current rises through coil L1 and Rsense to a peak value and then drops back to a valley due to the back EMF of the solenoid coil. Once the plunger moves completely, the current again starts to increase from the valley point until it reaches is maximum pull-in current. The maximum pull-in current is determined by the solenoid coil resistance. The crossover region of the first signal $I_{peak1}$, $I_{valley1}$ and the second signal $I_{peak2}$, $I_{valley2}$ is used to define the detection of plunger movement. The DC offset (R2, R4) can be varied depending on the crossover threshold resulting from component tolerances and type of solenoid used.

As the solenoid current (i.e., the first signal 201) drops from peak1 to valley1 (see FIG. 2B), the value of the second signal peak2 to valley2 (i.e., the second signal 202) crosses over and triggers the comparator U2 output to logic HIGH. This produces the pull-in signal (Ipullin). The logic HIGH U2 output toggles to logic LOW once valley2 starts following the first signal 201 until it reaches a maximum value. The pull-in signal indicates that the plunger has completely moved within the solenoid.

Figure 3B:
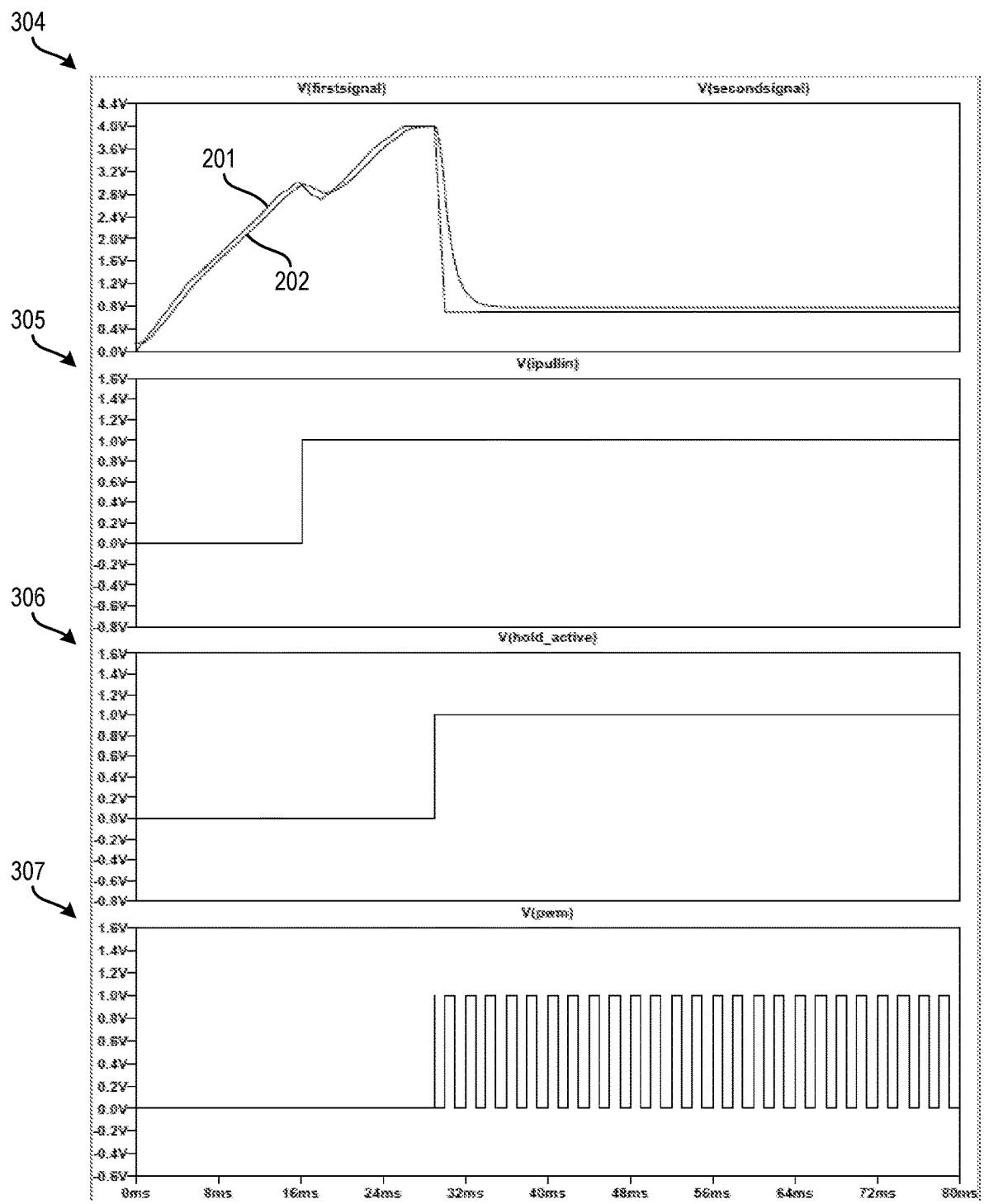
FIG. 3B depicts graphs of solenoid drive control logic waveforms for pull-in and hold activation modes according to one or more embodiments described herein.

Further, the solenoid current transits from valley1 to maximum pull-in current as shown in FIG. 3B. In particular, FIG. 3B graphs 304, 305, 306, 307 of solenoid drive control logic waveforms for pull-in and hold activation modes according to one or more embodiments described herein. The graph 304 shows the voltage of the first signal 201 and the second signal 202, the graph 305 shows the voltage of the pull-in signal, the graph 306 shows the voltage of the hold_active signal, and the graph 307 shows the voltage of the pulse width modulation signal of the PWM 112. As can be seen in the graphs 304, 305, the hold_active signal goes HIGH when the crossover occurs between the first signal 201 and the second signal 202, which is described further herein.

As shown in FIGS. 2A and 2B, the amplitudes of both the first signal 201 and the second signal 202 reach maximum values and the difference in amplitudes is nearly zero. Then, the comparator U2 output toggles to logic HIGH to produce the pull-in signal (Ipullin) indicating that the solenoid achieves maximum current conduction. The components R7, C3 is configured for a predetermined delay based on crossover duration of solenoid type.

With continued reference to the circuit 100 of FIGS. 1A and 1B, fault protect of active logic LOW signal is activated after a predetermined time of solenoid ON condition. If there is no pull-in active HIGH (to AND gate A6), then the solenoid switch M1 is turned-off by fault protect signal after the predetermined time. As an example, the fault protect time is calculated based on a maximum time taken to activate the hold mode. By default, the fault protect pin is logic HIGH when the solenoid is ON and goes active logic LOW after the predetermined time programmed in the control logic 110. When there is no hold_active signal (from flip-flop A7) then the fault protect arrangement will disable AND gate A2 to turn-off switch M1. Fault protect enable/disable function protects from mechanical disturbances, solenoid failure due to aging, etc.

Figure 4:
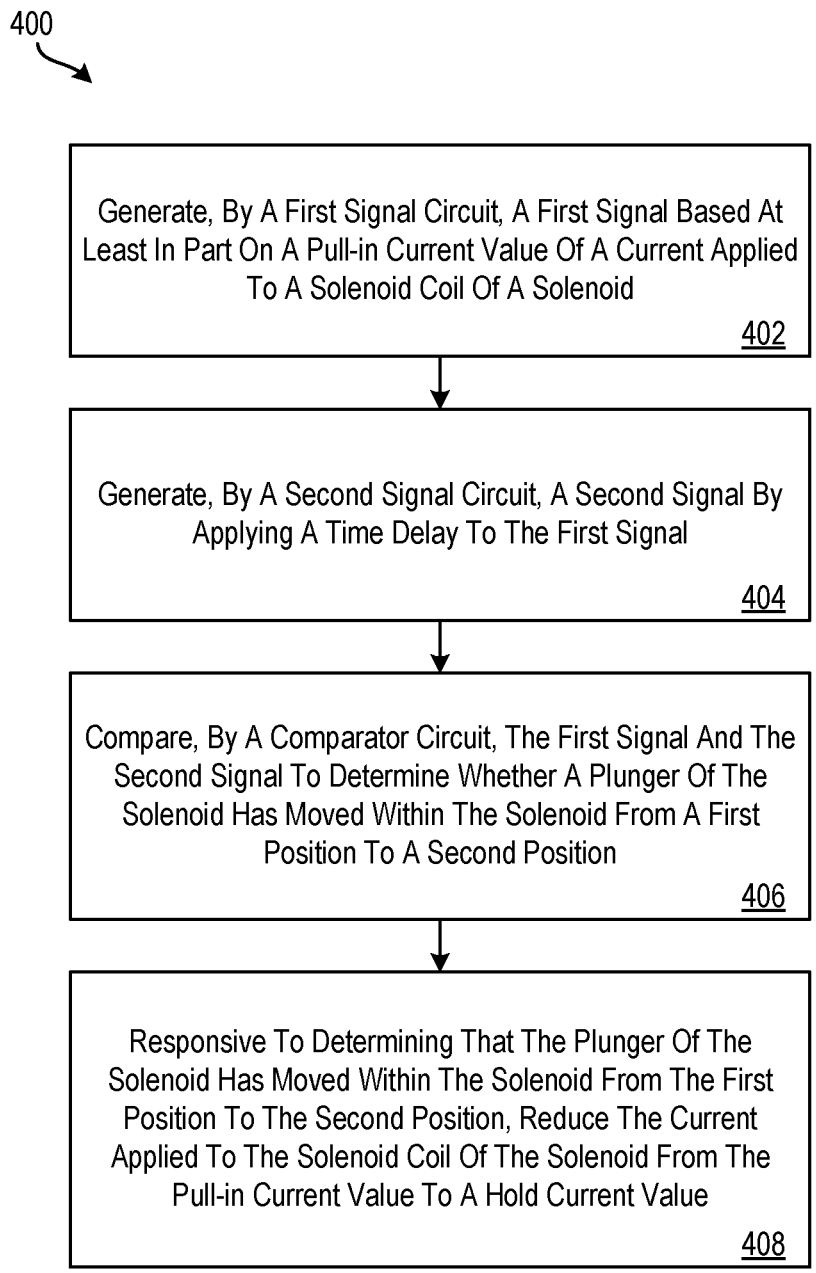
FIG. 4 depicts a flow diagram of a method for controlling a solenoid according to one or more embodiments described herein.

FIG. 4 depicts a flow diagram of a method 400 for controlling a solenoid according to one or more embodiments described herein. The features and functionality of the method 400 are now described with reference to the circuit 100 of FIGS. 1A and 1B as an example but are not so limited.

At block 402, the first signal circuit 120 of the circuit 100 generates a first signal based at least in part on a pull-in current value of a current applied to a solenoid coil of a solenoid.

At block 404, the second signal circuit 121 of the circuit 100 generates a second signal by applying a time delay to the first signal. In examples, the second signal circuit 121 includes a low pass network and an integrator amplifier.

At block 406, the comparator circuit 122 of the circuit 100 compares the first signal and the second signal to determine whether a plunger of the solenoid has completely moved within the solenoid from a first position to a second position. In examples, comparing the first signal and the second signal includes comparing a peak envelope of the first signal with a peak envelope of the second signal. The peak envelope of the first signal includes a first peak value and a first valley value, and the peak envelope of the second signal comprises a second peak value and a second valley value (see FIG. 2B). According to examples, the comparator circuit includes a first comparator and a second comparator. The first comparator and the second comparator generate pull-in and reset signals based at least in part on the first signal and the second signal.

At block 408, responsive to determining that the plunger of the solenoid has completely moved within the solenoid from the first position to the second position, control logic 110 of the circuit 100 reduces the current applied to the solenoid coil of the solenoid from the pull-in current value to a hold current value. According to an example embodiment, the hold current value is 30% to 40% of the pull-in current value.

Additional processes also may be included. For example, the method 400 can include varying a crossover threshold for the comparator circuit based at least in part on a tolerance of a component of the comparator circuit and/or based at least in part on a type of the solenoid. In some examples, the method 400 can include performing fault protection. The fault protection is performed, for example, after a fault detect time period of the solenoid being in an ON state. The fault detect time period is calculated based at least in part on a maximum time taken to activate a HOLD mode for the solenoid. In additional examples, the method 400 includes activating pulse width modulation responsive to determining that the plunger of the solenoid has completely moved within the solenoid from the first position to the second position.

It should be understood that the process depicted in FIG. 4 represents an illustration, and that other processes may be added or existing processes may be removed, modified, or rearranged without departing from the scope of the present disclosure.

The technical effects and benefits include a simple design having fewer switching elements resulting in a reduction in switching losses and complexity in the control logic. The technical effects and benefits also include a higher manufacturing yield rate. Additional technical effects and benefits include automatically switching to a hold current by energizing the PWM circuit included with a delay logic when the plunger reaches the second position. One or more of the described embodiments can be easily and efficiently implemented in existing solenoid drive circuits. In embodiments implementing fault protection, the fault protection provides protection against solenoid failures due to mechanical disturbances, ageing, and the like.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A method comprising:
    generating, by a first signal circuit, a first signal based at least in part on a pull-in current value of a current applied to a solenoid coil of a solenoid;
    generating, by a second signal circuit, a second signal by applying a time delay to the first signal;
    comparing, by a comparator circuit, the first signal and the second signal to determine whether a plunger of the solenoid has moved within the solenoid from a first position to a second position;
    responsive to determining that the plunger of the solenoid has moved within the solenoid from the first position to the second position, reducing the current applied to the solenoid coil of the solenoid from the pull-in current value to a hold current value; and activating pulse width modulation responsive to determining that the plunger of the solenoid has moved within the solenoid from the first position to the second position.

2. The method of claim 1, wherein comparing the first signal and the second signal further comprises comparing a peak envelope of the first signal with a peak envelope of the second signal.

3. The method of claim 2, wherein the peak envelope of the first signal comprises a first peak value and a first valley value, and wherein the peak envelope of the second signal comprises a second peak value and a second valley value.

4. The method of claim 1, further comprising varying a crossover threshold for the comparator circuit based at least in part on a tolerance of a component of the comparator circuit or based at least in part on a type of the solenoid.

5. The method of claim 1, further comprising performing fault protection.

6. The method of claim 5, wherein the fault protection is performed after a fault detect time period of the solenoid being in an ON state.

7. The method of claim 6, wherein the fault detect time period is calculated based at least in part on a maximum time taken to activate a HOLD mode for the solenoid.

8. The method of claim 1, wherein the hold current value is 30% to 40% of the pull-in current value.

9. The method of claim 1, wherein the comparator circuit comprises a first comparator and a second comparator, wherein the first comparator and the second comparator generate pull-in and reset signals based at least in part on the first signal and the second signal.

10. The method of claim 1, wherein the second signal circuit comprises a low pass network and an integrator amplifier.

11. A system comprising:
a first signal circuit to generate a first signal based at least in part on a pull-in current value of a current applied to a solenoid coil of a solenoid;
a second signal circuit to generate a second signal by applying a time delay to the first signal;
a comparator circuit to compare the first signal and the second signal to determine whether a plunger of the solenoid has moved within the solenoid from a first position to a second position;
a control logic to reduce the current applied to the solenoid coil of the solenoid from the pull-in current value to a hold current value responsive to determining that the plunger of the solenoid has moved within the solenoid from the first position to the second position; and
a pulse width modulation generator to activate pulse width modulation responsive to determining that the plunger of the solenoid has moved within the solenoid from the first position to the second position.

12. The system of claim 11, wherein comparing the first signal and the second signal further comprises comparing a peak envelope of the first signal with a peak envelope of the second signal.

13. The system of claim 12, wherein the peak envelope of the first signal comprises a first peak value and a first valley value, and wherein the peak envelope of the second signal comprises a second peak value and a second valley value.

14. The system of claim 11, further comprising fault protection logic to perform fault protection.

15. The system of claim 14, wherein the fault protection is performed after a fault detect time period of the solenoid being in an ON state.

16. The system of claim 15, wherein the fault detect time period is calculated based at least in part on a maximum time taken to activate a HOLD mode for the solenoid.

17. The system of claim 11, wherein the hold current value is 30% to 40% of the pull-in current value.

18. The system of claim 11, wherein the comparator circuit comprises a first comparator and a second comparator, wherein the first comparator and the second comparator generate pull-in and reset signals based at least in part on the first signal and the second signal.

19. The system of claim 11, wherein the second signal circuit comprises a low pass network and an integrator amplifier.

* * * * *